United States Patent
Makitani et al.

(10) Patent No.: US 12,206,239 B2
(45) Date of Patent: Jan. 21, 2025

(54) POWER SUPPLY SYSTEM AND POWER SUPPLY UNIT

(71) Applicant: Sansha Electric Manufacturing Co., Ltd., Osaka (JP)

(72) Inventors: Atsushi Makitani, Osaka (JP); Taro Uenoyama, Osaka (JP)

(73) Assignee: SANSHA ELECTRIC MANUFACTURING CO., LTD., Osaka (JP)

( * ) Notice: Subject to any disclaimer, the term of this patent is extended or adjusted under 35 U.S.C. 154(b) by 0 days.

(21) Appl. No.: 18/039,973

(22) PCT Filed: Jan. 27, 2021

(86) PCT No.: PCT/JP2021/002748
§ 371 (c)(1),
(2) Date: Jun. 2, 2023

(87) PCT Pub. No.: WO2022/162764
PCT Pub. Date: Aug. 4, 2022

(65) Prior Publication Data
US 2024/0006880 A1 Jan. 4, 2024

(51) Int. Cl.
*H02J 1/10* (2006.01)

(52) U.S. Cl.
CPC .................... *H02J 1/102* (2013.01)

(58) Field of Classification Search
CPC .......... H02J 1/102; H02J 1/106; H03K 17/18; H03K 17/79; H03K 17/691; H03K 17/78
See application file for complete search history.

(56) References Cited

U.S. PATENT DOCUMENTS 6,301,133 B1  10/2001  Cuadra et al.
2004/0239487 A1* 12/2004  Hershbarger ............ H04L 5/14
                                                                    375/258
(Continued)

FOREIGN PATENT DOCUMENTS

CN  209963757 U  1/2020
JP  H0158247 U   4/1989
(Continued)

OTHER PUBLICATIONS

International Search Report and Written Opinion issued in corresponding International Patent Application No. PCT/JP2021/002748 (with English translation of International Search Report) mailed Apr. 13, 2021 (10 pages).

(Continued)

*Primary Examiner* — Rexford N Barnie
*Assistant Examiner* — Thai H Tran
(74) *Attorney, Agent, or Firm* — Kilyk & Bowersox, P.L.L.C.

(57) ABSTRACT

An object of the present invention is to enable two or more power supply units constituting a power supply system to be synchronized to stably operate the power supply system. A power supply system 100 includes two or more power supply units 10 to 13, the power supply units 10 to 13 cooperating to supply DC power to a shared load 22, the power supply units 10 to 13 including a power supply main circuit 30 that converts AC power inputted from the outside into DC power; a control unit 36 that controls the power supply main circuit 30; a pair of synchronous terminals Z1, Z2 respectively connected to a pair of synchronous signal lines ZCL; a transmission unit 35 that outputs a trigger signal TG by establishing conduction between the pair of synchronous signal lines ZCL; and a reception unit 35 that detects a conductive state between the pair of synchronous (Continued)

signal lines ZCL and that receives the trigger signal TG, wherein the power supply main circuit 30 stops outputting based on timing of receiving the trigger signal TG.

5 Claims, 8 Drawing Sheets

(56)  References Cited

U.S. PATENT DOCUMENTS

| | | | |
|---|---|---|---|
| 2012/0256659 A1* | 10/2012 | Kiadeh | H02M 3/1584 327/108 |
| 2014/0160814 A1* | 6/2014 | Morimoto | H02M 3/1584 363/65 |
| 2016/0276844 A1 | 9/2016 | Gekinozu | |
| 2017/0170714 A1 | 6/2017 | Nguyen et al. | |
| 2020/0122265 A1 | 4/2020 | Kawai et al. | |
| 2021/0028686 A1 | 1/2021 | Jiang et al. | |

FOREIGN PATENT DOCUMENTS

| | | | |
|---|---|---|---|
| JP | H1094174 A | | 4/1998 |
| JP | 2000152506 A | * | 5/2000 |
| JP | 2004080869 A | | 3/2004 |
| JP | 2006304419 A | | 11/2006 |
| JP | 2009148032 A | | 7/2009 |
| JP | 2012060692 A | | 3/2012 |
| JP | 2014043098 A | | 3/2014 |
| JP | 2014147196 A | | 8/2014 |
| JP | 2017127119 A | | 7/2017 |
| JP | 2017127195 A | | 7/2017 |
| WO | 2013136475 A1 | | 9/2013 |
| WO | 2022162763 A1 | | 8/2022 |
| WO | 2022162765 A1 | | 8/2022 |

OTHER PUBLICATIONS

Extended European Search Report issued in corresponding European Patent Application No. 21922788.1 dated Oct. 9, 2024 (8 pages).

* cited by examiner

POWER SUPPLY SYSTEM AND POWER SUPPLY UNIT

This application is a National Stage Application of PCT/JP2021/02748, filed Jan. 27, 2021.

TECHNICAL FIELD

The present invention relates to a power supply system and a power supply unit, and more particularly to a power supply system that includes two or more power supply units and in which the power supply units cooperate to supply DC power to a shared load.

BACKGROUND ART

A power supply system that includes two or more power supply units and that supplies DC power from each power supply unit to a common load is known (for example, Patent Literature 1 and 2). In this type of power supply system, a power supply apparatus having various characteristics can be realized by connecting two or more power supply units. For example, in an operation test of an electric vehicle or a power conditioner, or the like, such a power supply system is used as a simulated power supply that simulates a battery, a solar panel, or the like.

In this kind of power supply system, there is a problem that the output becomes unstable in a case where there is a deviation in the operation timings of two or more power supply units. In particular, when the power supply system starts an output, there is a problem that the operation becomes unstable in a case where there is a deviation in the output start timing of each power supply unit. For example, in a case where an output start command is transmitted to each of the power supply units via digital communication, there is a problem that a non-negligible deviation in output start timing may occur.

CITATION LIST

Patent Literature 1: JP 2009-148032 A
Patent Literature 2: JP 2014-147196 A

SUMMARY OF INVENTION

Technical Problem

The present invention was conceived in view of the above circumstances, and an object thereof is to synchronize two or more power supply units constituting a power supply system to allow the power supply system to operate stably. Yet another object is to provide a power supply unit that is used for such a power supply system.

Solution to Problem

A power supply system according to a first embodiment of the present invention is a power supply system including two or more power supply units, the power supply units cooperating to supply DC power to a shared load, the power supply units including a power supply main circuit that converts AC power inputted from the outside into DC power; a control unit that controls the power supply main circuit; and a pair of synchronous terminals respectively connected to a pair of synchronous signal lines; a transmission unit that outputs a trigger signal by establishing conduction between the pair of synchronous signal lines; and a reception unit that detects a conductive state between the pair of synchronous signal lines and that receives the trigger signal, in which the power supply main circuit starts outputting based on timing of receiving the trigger signal.

By adopting such a configuration, the output start operations of two or more power supply units can be synchronized, and the operation of the power supply system at the start of outputting can be stabilized.

A power supply system according to a second embodiment of the present invention is configured such that, in addition to the above configuration, one predetermined power supply unit among the two or more power supply units transmits the trigger signal.

A power supply system according to a third embodiment of the present invention is configured such that, in addition to the above configuration, the transmission unit and the reception unit each include a photocoupler, and the pair of synchronous signal lines is isolated from the power supply units by the photocoupler. By adopting such a configuration, it is possible to yield high noise resistance and make it possible to suppress malfunction.

A power supply system according to a fourth embodiment of the present invention is configured such that, in addition to the above configuration, the power supply main circuit starts outputting based on an edge of the trigger signal.

A power supply unit according to a fifth embodiment of the present invention is a power supply unit that, in addition to the above configuration, is connected to another power supply unit and that cooperates with the another power supply unit to supply DC power to a shared load, the power supply unit including a power supply main circuit that converts AC power inputted from the outside into DC power; a control unit that controls the power supply main circuit; a pair of synchronous terminals respectively connected to a pair of synchronous signal lines; a transmission unit that outputs a trigger signal by establishing conduction between the pair of synchronous signal lines; and a reception unit that detects a conductive state between the pair of synchronous signal lines and that receives the trigger signal, in which the power supply main circuit starts outputting based on timing of receiving the trigger signal.

Advantageous Effects of Invention

With the present invention, two or more power supply units constituting a power supply system can be synchronized to stably operate the power supply system. Furthermore, a power supply unit used for such a power supply system can be provided.

DESCRIPTION OF EMBODIMENTS

First Embodiment (1) Outline of Power Supply System 100

Figure 1:
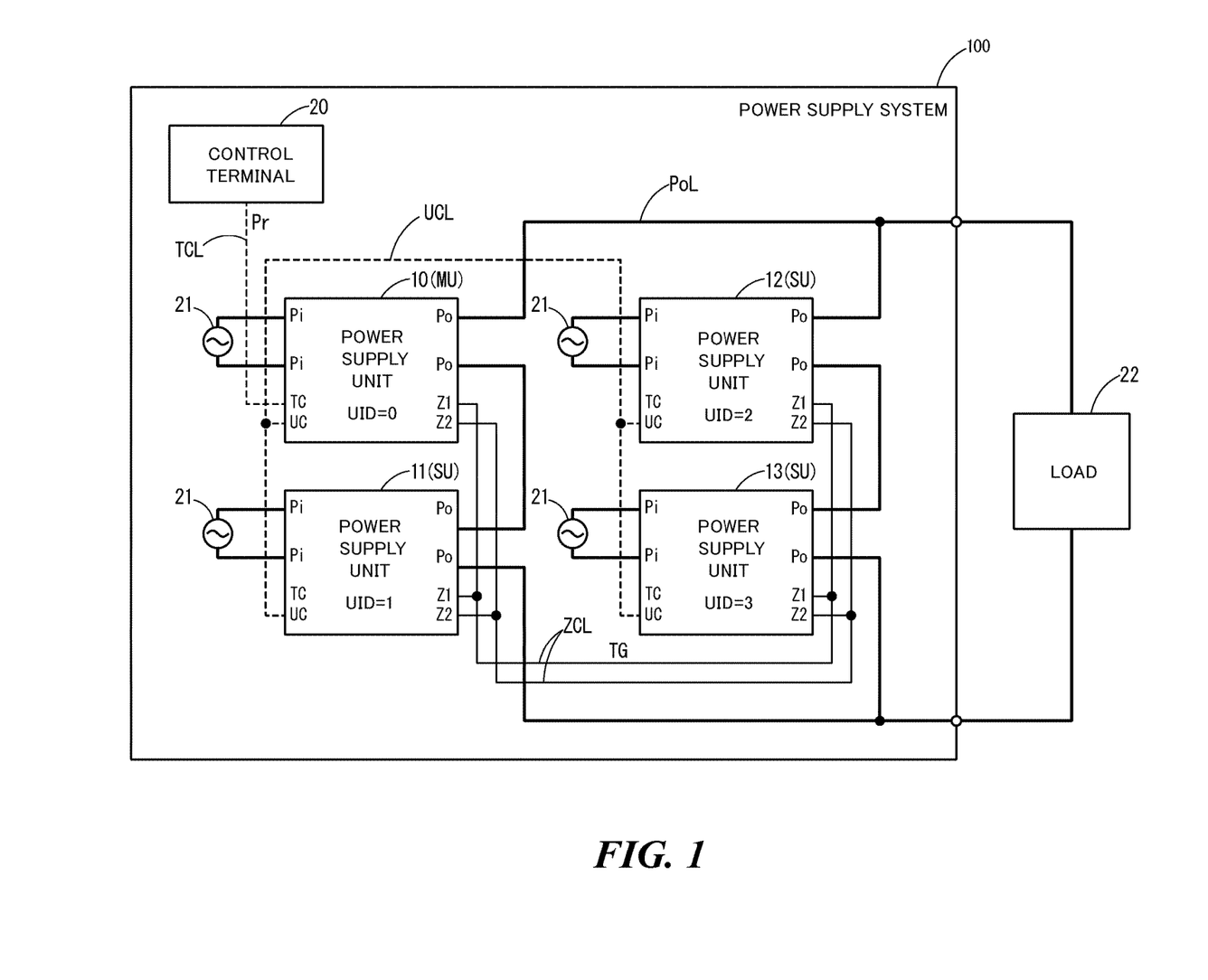
FIG. 1 is a diagram illustrating an example of a schematic configuration of a power supply system 100 according to a first embodiment of the present invention.

FIG. 1 is a diagram illustrating an example of a schematic configuration of a power supply system 100 according to a first embodiment of the present invention. The power supply system 100 is a power supply apparatus that converts AC power 21 supplied from the power grid into the desired DC power and supplies the DC power to a load 22.

The power supply system 100 includes two or more power supply units 10 to 13 connected to the load 22 via an output line PoL. Each of the power supply units 10 to 13 converts AC power supplied from the outside into DC power, based on a control parameter Pr from a control terminal 20, and supplies the DC power to the load 22. Furthermore, balance adjustment is performed between the power supply units 10 to 13 based on the control parameter Pr from the control terminal 20.

Each power supply unit 10 to 13 is a device with the same configuration, and is pre-associated with a unique identification number 0 to 3. The identification number is a unit identification information UID for the power supply units 10 to 13 to identify each other. The power supply units 10 to 13 are connected to each inter-unit communication line UCL, and communication is enabled between arbitrary power supply units 10 to 13 by using the unit identification information UID. Further, the power supply units 10 to 13 are connected to a pair of synchronous communication lines ZCL, thus enabling the output start timing to be synchronized.

One of the power supply units 10 to 13 is determined beforehand to be the master unit MU, while the others are the slave units SU, and only the master unit MU is connected to the control terminal 20. For example, the power supply unit 10 associated with the smallest identification number 0 is the master unit MU, and receives the control parameter Pr from the control terminal 20 via a terminal communication line TCL. However, the other power supply units 11 to 13 are the slave unit SU, and receive the control parameter Pr from the master unit MU via the inter-unit communication line UCL. Note that the master unit MU and the slave units SU indicate the functions of the power supply units 10 to 13 in data communication before the start of outputting, and the power supply units 10 to 13 after the start of the output operate without distinction between the master unit MU and the slave units SU.

The control terminal 20 is a device that controls the power supply system 100, generates a control parameter Pr of the power supply units 10 to 13, and transmits the control parameter Pr to the master unit MU. The control parameter Pr is generated and outputted based on, for example, a user operation. For example, a PC on which a dedicated program is installed can be used as the control terminal 20.

The terminal communication line TCL is a wired or wireless communication path that is used for data communication between the control terminal 20 and the master unit MU. For communication with the control terminal 20, for example, a packet communication system for transmitting and receiving TCP/IP (Transmission Control Protocol/Internet Protocol) packets can be adopted, and a connection can also be made via a Local Area Network (LAN) or the Internet.

The inter-unit communication line UCL is a wired communication path that is used for data communication between the power supply units 10 to 13. For the inter-unit communication, for example, a multi-master bus communication system as per the controller area network (CAN) standard is adopted, and data can be transmitted from any of the power supply units 10 to 13 to any of the power supply units 10 to 13.

The synchronous communication lines ZCL are wired communication paths for transmitting a trigger signal indicating the start of outputting, and each include a pair of signal lines isolated from the power supply units 10 to 13 and having a photocoupler interposed therebetween. The pair of synchronous communication lines ZCL are capable of transitioning between a conductive state and a non-conductive state, and the trigger signal is a pulse signal that causes conduction between the pair of synchronous communication lines ZCL in a fixed time interval, and is transmitted from the master unit MU (power supply unit 10) to all the slave units SU (power supply units 11 to 13).

(2) Power Supply Units 10 to 13

Figure 2:
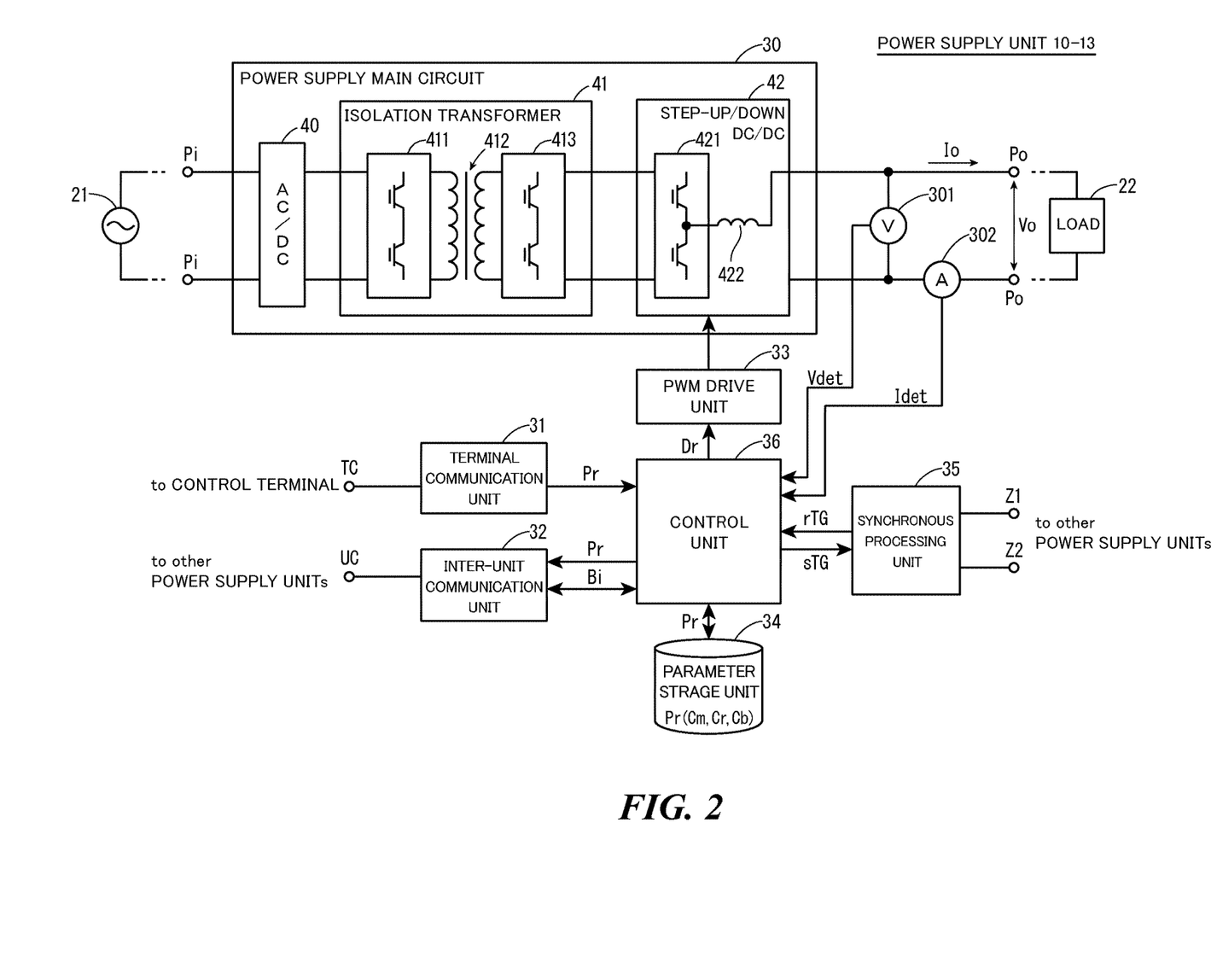
FIG. 2 is a diagram showing an example of a detailed configuration of the power supply units 10 to 13.

FIG. 2 is a diagram showing an example of a detailed configuration of the power supply units 10 to 13. The power supply units 10 to 13 include a power supply main circuit 30, a voltage detection unit 301, a current detection unit 302, a terminal communication unit 31, an inter-unit communication unit 32, a PWM drive unit 33, a parameter storage unit 34, a synchronous processing unit 35, and a control unit 36.

A) Power Supply Main Circuit 30

The power supply main circuit 30 is a circuit that converts AC power inputted from the power grid via an input terminal Pi into DC power and outputs the DC power to the load 22 via an output terminal Po. The operation of the power supply main circuit 30 is controlled based on the control parameter Pr. Specifically, when the operation mode is constant current operation (CC), the output current operates to match the target value Cr, and when the operation mode is constant voltage operation (CV), an output voltage Vo is controlled to match the target value Cr. The target value Cr is a target current Iref in constant current operation or a target voltage Vref in constant voltage operation.

The power supply main circuit 30 is a bidirectional power supply (regenerative power supply) capable of bidirectionally converting AC power and DC power, and capable not only of performing a power operation to convert an AC voltage into a DC voltage and supply energy to the load 22, but also of performing a regenerative operation to convert a DC voltage into an AC voltage and absorb energy from the load 22, according to the status of the load 22.

The power supply main circuit 30 includes an AC/DC converter 40 that converts an AC voltage into a DC voltage, an isolation transformer 41 for isolating the input from the output, and a step-up/down DC/DC converter 42 that controls the output voltage Vo.

The AC/DC converter 40 is a bidirectional converter capable of bidirectionally converting AC power and DC power, and can be configured using, for example, a three-state switching element.

The isolation transformer 41 is a bidirectional DC/DC converter capable of bidirectionally transmitting DC power while ensuring isolation between the primary side and the secondary side, and includes a transformer 412, a DC/AC converter 411 connected to the primary side of the transformer 412, and an AC/DC converter 413 connected to the secondary side of the transformer 412. The direct current inputted from the AC/DC converter 40 is converted into an alternating current by the DC/AC converter 411, and, after passing through the transformer 412, is converted into a direct current again by the AC/DC converter 413. When the alternating current passing through the transformer 412 has a high frequency, isolation can be performed using a small transformer, and the entire device can be downsized.

The step-up/down DC/DC converter 42 is a bidirectional DC/DC converter that controls the output voltage Vo based on the control parameter Pr, and a chopper circuit including a switching circuit 421 and an inductance 422, for example, can be used. The switching circuit 421 includes two switching elements connected in series, and one end of the inductance 422 is connected to a connection point between the two switching elements. The two switching elements operate so as to alternately repeat a state in which one element is turned on while the other element is turned off, and a state in which one element is turned off while the other element is turned on, based on a PWM signal from the PWM drive unit 33, and generate the output voltage Vo according to the corresponding duty ratio.

B) Voltage Detection Unit 301 and Current Detection Unit 302

The voltage detection unit 301 is means for detecting the output voltage Vo of the power supply main circuit 30. The detection value of the voltage detection unit 301 is inputted to the control unit 36 as a detected voltage Vdet. The current detection unit 302 is means for detecting an output current Io of the power supply main circuit 30. The detection value of the current detection unit 302 is inputted to the control unit 36 as a detected current Idet.

C) Terminal Communication Unit 31

The terminal communication unit 31 is a packet communication means that communicates with the control terminal 20 via the terminal communication line TCL. The terminal communication unit 31 of the master unit MU receives the control parameter Pr from the control terminal 20 and outputs the control parameter Pr to the control unit 36. The terminal communication unit 31 of the slave unit SU is not used, and the terminal communication unit 31 of the master unit MU acquires not only the control parameter Pr of the master unit MU but also the control parameter Pr of the slave unit SU.

D) Inter-Unit Communication Unit 32

The inter-unit communication unit 32 is means for performing data communication between the power supply units 10 to 13 via the inter-unit communication line UCL. In inter-unit communication, any of the power supply units 10 to 13 is capable of outputting transmission data onto the inter-unit communication line UCL. The transmission data includes the unit identification information UID of the transmission source or the transmission target, and each power supply unit 10 to 13 monitors the transmission data on the inter-unit communication line UCL and selectively receives data necessary for that power supply unit based on the unit identification information UID of the transmission source or the transmission target.

The control parameter Pr for the slave units SU is transmitted from the master unit MU to the slave units SU by inter-unit communication. The detected current Idet and the detected voltage Vdet detected by each power supply unit 10 to 13 are transmitted as balance information Bi to the other power supply units 10 to 13 by inter-unit communication.

E) PWM Drive Unit 33

The PWM drive unit 33 generates a PWM (Pulse Wide Modulation) signal based on a drive signal Dr generated by the control unit 36, and outputs the PWM signal to the switching circuit 421. Therefore, the power supply main circuit 30 outputs a voltage corresponding to the drive signal Dr.

F) Parameter Storage Unit 34

The parameter storage unit 34 is storage means for storing various parameters referred to by the control unit 36, and holds the control parameter Pr received from the control terminal 20. The control parameter Pr includes operation mode information Cm, the target value Cr, and balance adjustment target information Cb.

The operation mode information Cm is a parameter indicating constant current operation (CC) or constant voltage operation (CV) as the control method of the power supply system 100, and is a parameter common to each power supply unit 10 to 13. The target value Cr is a target current Iref during constant current operation (CC) and a target voltage Vref during constant voltage operation (CV). The balance adjustment target information Cb is an identification number of one or more other power supply units 10 to 13 to be referred to when balance adjustment is performed. The balance adjustment target information Cb is automatically generated by the user designating the unit configuration and the operation mode on the control terminal 20. Therefore, the user is able to construct the power supply system 100 without being conscious of balance adjustment.

G) Synchronous Processing Unit 35

The synchronous processing unit 35 is means for synchronizing the operation timing of the power supply units 10 to 13, and transmits and receives a trigger signal TG for matching the operation timing via synchronous terminals Z1 and Z2.

The synchronous processing unit 35 is capable of outputting the trigger signal TG to the synchronous communication lines ZCL, and of detecting the trigger signal on the synchronous communication lines ZCL. The trigger signal TG is outputted as a pulse signal corresponding to a conductive state of the pair of synchronous communication lines ZCL. Therefore, the trigger signal TG can be quickly detected in all the power supply units 10 to 13, thereby yielding a high noise resistance and making it possible to suppress malfunction.

When the trigger transmission signal sTG is inputted from the control unit 36, the synchronous processing unit 35 of the master unit MU outputs the trigger signal TG to the pair of synchronous communication lines ZCL. However, the synchronous processing units 35 of the master unit MU and the slave units SU monitor the synchronous communication lines ZCL, and upon detecting the trigger signal TG, output a trigger reception signal rTG to the control unit 36.

H) Control Unit 36

The control unit 36 generates the drive signal Dr based on the detected voltage Vdet or the detected current Idet, and controls the power supply main circuit 30 via the PWM drive unit 33. In addition, the terminal communication unit 31 and the inter-unit communication unit 32 are controlled to perform data communication with the control terminal 20 and other power supply units 10 to 13. Furthermore, the synchronous processing unit 35 is controlled to perform synchronized control of the output start timing between the power supply units 10 to 13.

(3) Detailed Configuration of Synchronous Processing Unit 35

Figure 3:
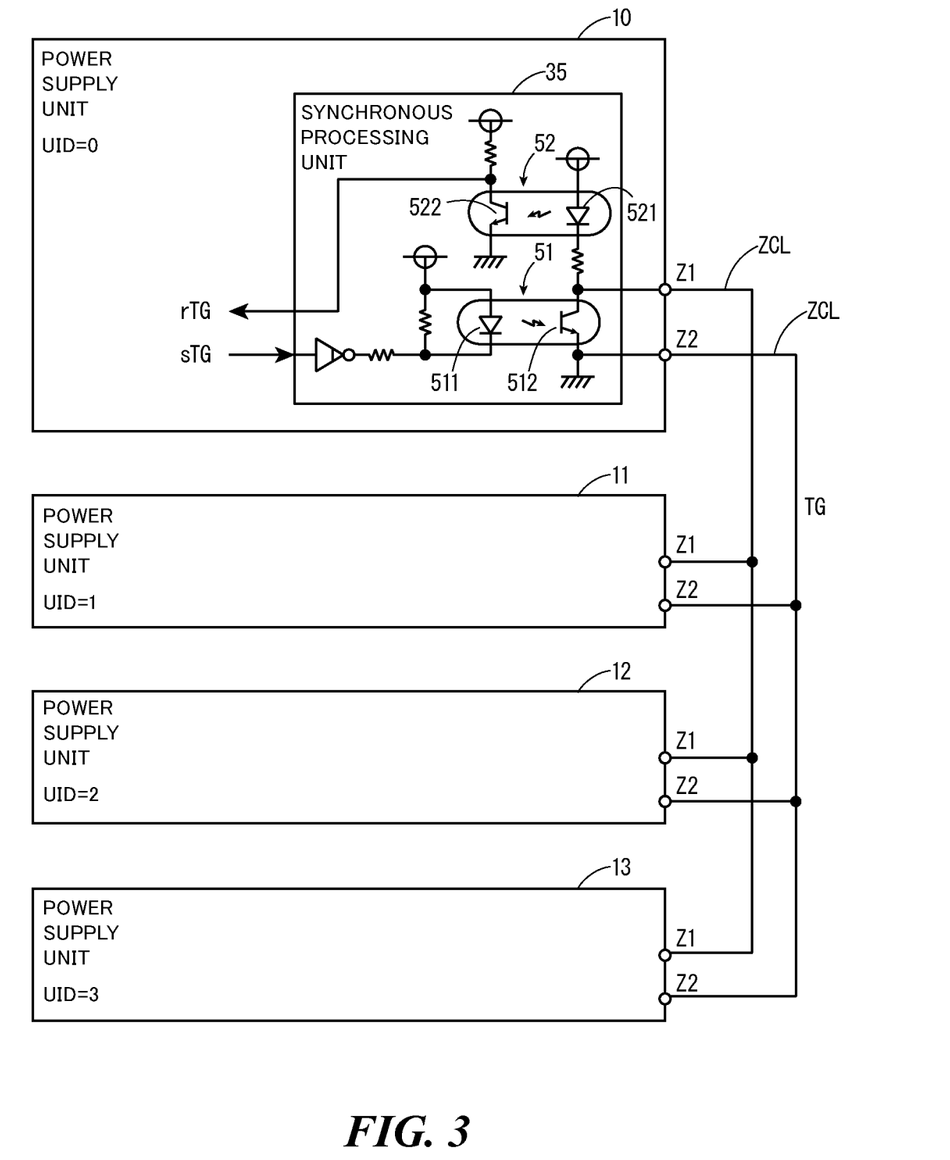
FIG. 3 is a diagram showing an example of a detailed configuration of the synchronous processing unit 35.

FIG. 3 is a diagram showing an example of a detailed configuration of the synchronous processing unit 35. The synchronous processing unit 35 has two synchronous terminals Z1 and Z2, and the respective terminals Z1 and Z2 of the two or more power supply units 10 to 13 are connected using a pair of synchronous communication lines ZCL. The synchronous processing unit 35 transmits a trigger signal by establishing conduction between the pair of synchronous communication lines ZCL, and receives the trigger signal by detecting a conductive state between the synchronous communication lines ZCL.

The synchronous processing unit 35 includes two photocouplers 51 and 52. The photocoupler 51 is a transmission photocoupler for transmitting the trigger signal, and the photocoupler 52 is a reception photocoupler for receiving the trigger signal.

The transmission photocoupler 51 includes a light-emitting element 511 driven by a trigger transmission signal sTG from the control unit 36 and a light-receiving element 512 that establishes conduction between the terminals Z1 and Z2 when the light-emitting element 511 emits light. When the trigger transmission signal sTG is not inputted, there is no conduction between the terminals Z1 and Z2, and when the trigger transmission signal sTG is inputted from the control unit 36, conduction is established between the terminals Z1 and Z2.

The reception photocoupler 52 includes a light-emitting element 521 driven by conduction between the pair of synchronous communication lines ZCL, and a light-receiving element 522 that outputs a trigger reception signal rTG when the light-emitting element 521 emits light. For this reason, the trigger reception signal rTG is not outputted when there is no conduction between the pair of synchronous communication lines ZCL, whereas the trigger reception signal rTG is outputted to the control unit 36 when there is conduction between the pair of synchronous communication lines ZCL.

The terminals Z1 and Z2 of all the power supply units 10 to 13 are respectively connected via a pair of synchronous communication lines ZCL, and the light-receiving element 512 of the transmission photocoupler 51 is connected in parallel. Therefore, when the trigger signal is transmitted from any one of the power supply units 10 to 13, the pair of synchronous communication lines ZCL conduct. The light-emitting element 521 of the reception photocoupler 52 is connected in series with the light-receiving element 512 of the transmission photocoupler 51, detects a conductive state or a non-conductive state between the pair of synchronous communication lines ZCL, and generates a trigger reception signal rTG.

Figure 4:
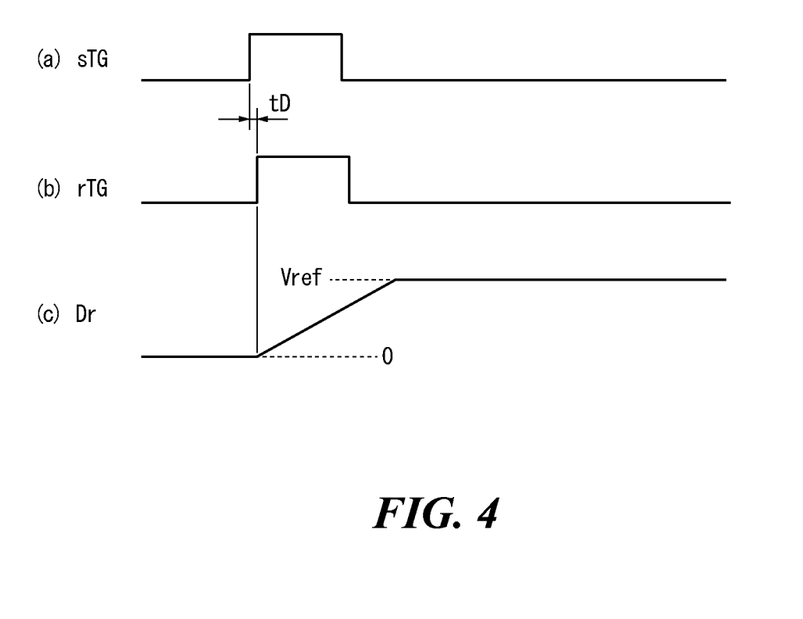
FIG. 4 is a timing chart showing an example of an output start operation of the power supply system 100.

FIG. 4 is a timing chart showing an example of an output start operation of the power supply system 100. (a) in FIG. 4 represents the trigger transmission signal sTG in the master unit MU, and (b) and (c) are the trigger reception signal rTG and the drive signal Dr of each of the power supply units 10 to 13. Here, the operation mode is constant voltage (CV) operation, and output control is performed so that the output voltage Vo matches the target voltage Vref. In addition, at the start of the output, soft start control is performed in which the output voltage Vo is changed at a predetermined time or rate of change so as to then reach the target voltage Vref. Both the master unit MU and the slave units SU start to output power based on the trigger reception signal rTG.

In the master unit MU, after the inter-unit communication unit 32 transmits the control parameter Pr to all the slave units SU, the control unit 36 generates the trigger transmission signal sTG, and the synchronous processing unit 35 outputs the trigger signal TG to the synchronous communication lines ZCL. The trigger transmission signal sTG is generated as a pulse signal having a predetermined width.

In the master unit MU and the slave units SU, when the pair of synchronous communication lines ZCL conducts, the synchronous processing unit 35 generates the trigger reception signal rTG and outputs the trigger reception signal rTG to the control unit 36. The control unit 36 starts outputting the drive signal Dr based on the timing of receiving the trigger reception signal rTG, and the power supply main circuit 30 starts outputting power. In FIG. 4, the drive signal Dr is outputted based on the leading edge of the trigger reception signal rTG, but the drive signal Dr can also be outputted based on the trailing edge of the trigger reception signal rTG.

The trigger reception signal rTG is a pulse signal similar to the trigger transmission signal sTG, and is delayed by a delay time tD after the trigger transmission signal sTG. The delay time tD is mainly a delay time of the photocouplers 51 and 52, and is on the order of several tens of microseconds. Therefore, the time is sufficiently shorter than the control cycle by the control unit 36, for example, 250 microseconds, and can be ignored.

Here, in a case where the output start command is transmitted between the power supply units 10 to 13 by digital communication via the inter-unit communication line UCL, the communication time becomes much longer than the delay time tD, and the communication time varies. Therefore, there is a problem that a significant deviation occurs in the output start timing of the power supply units 10 to 13, and the operation at the start of the output becomes unstable. In contrast, by quickly transmitting a trigger signal via the synchronous communication lines ZCL, the timing for starting to output power can be substantially synchronized, and the operation at the start of the output can be stabilized. In exactly the same manner, even in a case where the target value is changed during the output, the output change timing of the power supply units 10 to 13 can be substantially synchronized by transmitting the trigger signal via the isolated communication lines ZCL, and the operation at the time of the output change can be stabilized.

Furthermore, by transmitting the trigger signal in a conductive or non-conductive state, noise resistance can be improved and malfunction can be prevented. Further, the noise resistance can be further improved by interposing a photocoupler.

Note that, because the delay time tD of the photocouplers 51 and 52 is an extremely short time, the master unit MU is also capable of outputting the drive signal Dr based on the trigger transmission signal sTG instead of the trigger reception signal rTG.

(4) Operation at Start of Output

Figure 5:
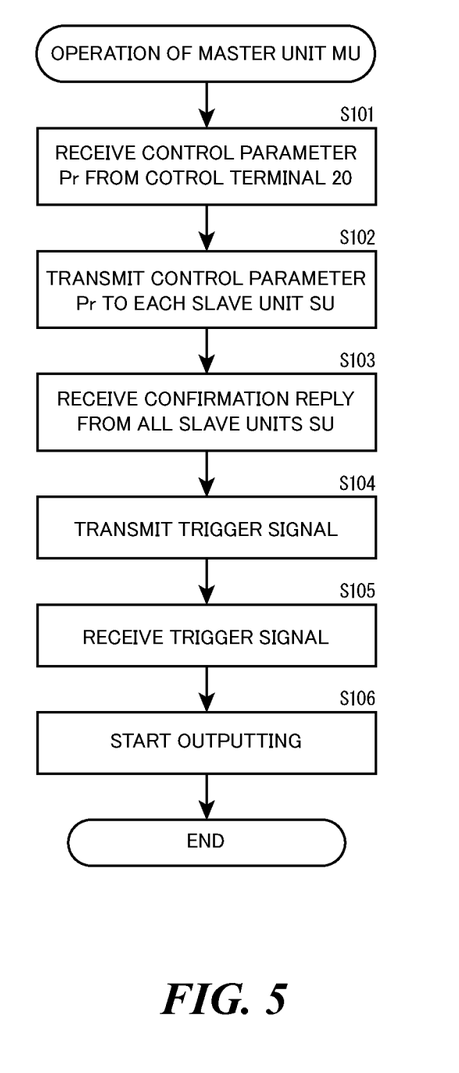
FIG. 5 is a flowchart showing an example of the operation of the master unit MU.

Steps S101 to S106 in FIG. 5 are a flowchart showing an example of the operation of the master unit MU. This flowchart is started by a data transmission request from the control terminal 20.

The terminal communication unit 31 receives the control parameter Pr from the control terminal 20 via the terminal communication line TCL (step S101). Among the received data, the control parameter Pr for the master unit is stored in the parameter storage unit 34, and the inter-unit communication unit 32 transmits the control parameter Pr for the slave units to each slave unit SU via the inter-unit communication line UCL (step S102). Each slave unit SU, having received the control parameter Pr, transmits a data reception confirmation reply to the master unit MU.

The inter-unit communication unit 32 receives the confirmation replies from each slave unit SU. After receiving a confirmation reply from all the slave units SU, the synchronous processing unit 35 transmits the trigger signal TG to the synchronous communication lines ZCL (steps S103 and S104). When the synchronous processing unit 35 receives the trigger signal TG, the control unit 36 generates the drive signal Dr, and the power supply main circuit 30 starts outputting (steps S105 and S106).

Figure 6:
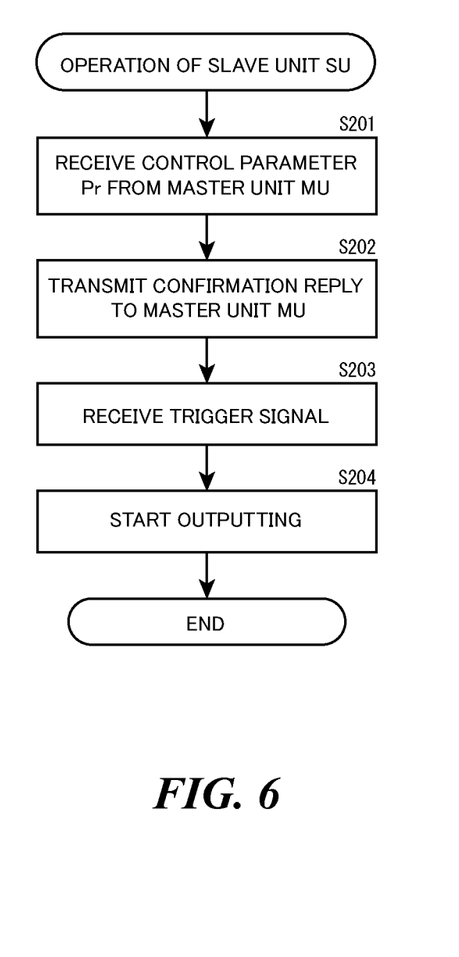
FIG. 6 is a flowchart showing an example of the operation of the slave units SU.

Steps S201 to S204 in FIG. 6 are a flowchart showing an example of the operation of the slave units SU. This flowchart is started by transmission of the control parameter Pr from the master unit MU.

The inter-unit communication unit 32 receives the control parameter Pr from the master unit MU (step S201). The received control parameter Pr is stored in the parameter storage unit 34, and a reception confirmation reply is transmitted to the master unit MU (step S202). Thereafter, when the synchronous processing unit 35 receives the trigger signal TG, the control unit 36 generates the drive signal Dr, and the power supply main circuit 30 starts outputting (steps S203 and S204).

Second Embodiment

In the above embodiment, an example of a power supply system 100 that transmits a trigger signal via the synchronous communication lines ZCL and synchronizes the output start timing of the power supply units 10 to 13 has been described. In contrast, in the present embodiment, an example in which the occurrence of an abnormality in any power supply unit 10 to 13 is quickly transmitted to the other power supply units 10 to 13 by using the synchronous communication lines ZCL will be described.

When the power supply system 100 is supplying power to the load 22, in a case where failure occurs in any of the two or more power supply units 10 to 13, for example in a case where an abnormal temperature rise is detected, an excessive load is applied to the other power supply units 10 to 13 due to a reduction in the output of the power supply unit 10 to 13, and there is a risk of damage to the normal power supply units 10 to 13. Therefore, in a case where an abnormality is found in any of the power supply units 10 to 13 that are outputting power, it is desirable to quickly stop the output operation of all the power supply units 10 to 13. Therefore, by using the synchronous communication lines ZCL to transmit the error signal ER from the failed power supply unit 10 to 13 to the normal power supply units 10 to 13, the outputs of all the power supply units 10 to 13 are quickly stopped. The error signal ER is transmitted to the synchronous signal lines ZCL as a signal that is distinguishable from the trigger signal TG to start outputting.

Figure 7:
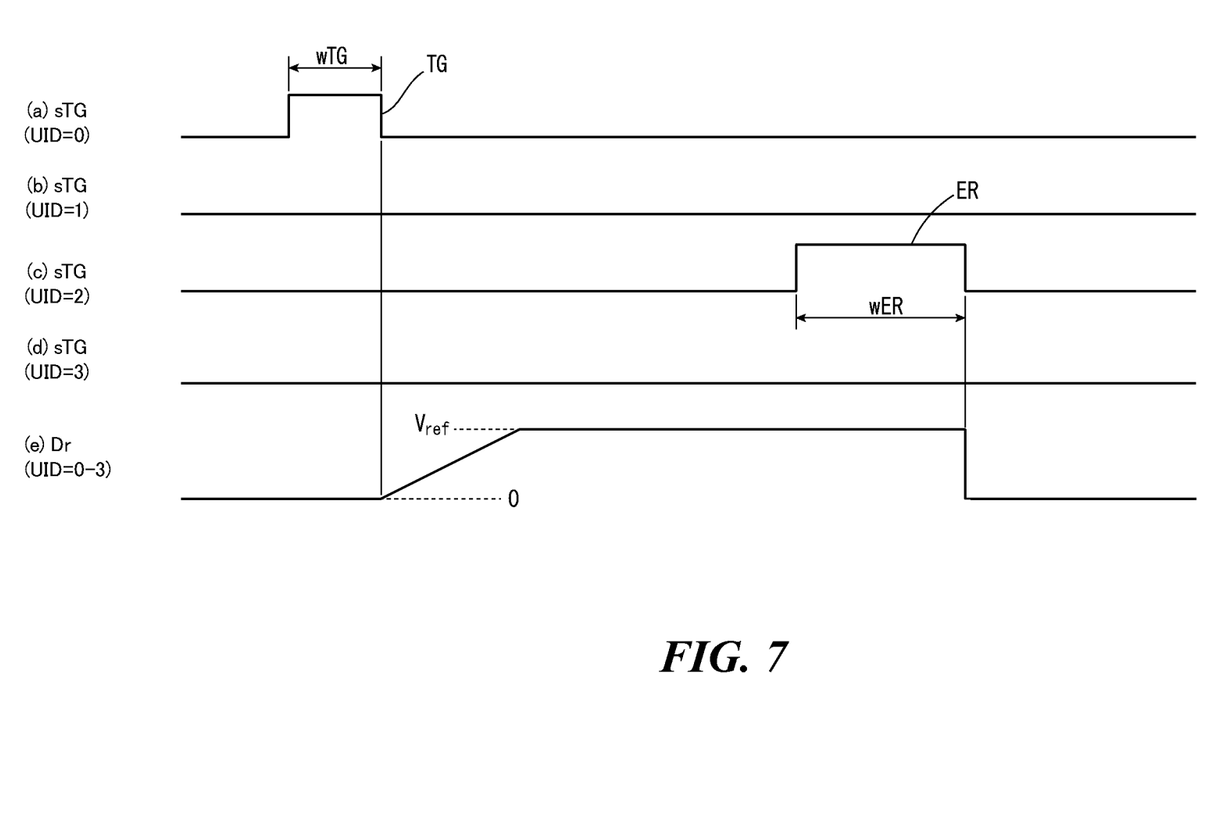
FIG. 7 is a timing chart showing an example of the operation of the power supply system 100 according to a second embodiment of the present invention.

FIG. 7 is a timing chart showing an example of the operation of the power supply system 100 according to the second embodiment of the present invention. (a) to (d) in FIG. 7 show the trigger transmission signals sTG inputted to the synchronous processing unit 35 of the power supply units 10 to 13, and (e) shows the drive signal Dr of the power supply units 10 to 13. Because the configuration of the power supply system 100 is the same as that in the case of FIG. 1, redundant descriptions will be omitted.

The trigger signal TG is a signal transmitted only by the master unit MU, whereas the error signal ER is a signal that is transmittable by any power supply unit 10 to 13, regardless of whether the same is the master unit MU or a slave unit SU. In addition, the trigger signal TG is a signal for starting outputting and is transmitted before power output is started, whereas the error signal ER is a signal providing an alert regarding the occurrence of an abnormality and for stopping the output, which is transmitted during the power output.

The trigger signal TG and the error signal ER are distinguished by affording the signals different signal output times. For example, the pulse width wER of the error signal ER is longer than the pulse width wTG of the trigger signal TG, and in a case where any signal is outputted on the synchronous communication lines ZCL, it is possible to discriminate, based on the signal duration, whether the signal is the trigger signal TG or the error signal ER.

In a case where the master unit MU (UID=0) outputs the trigger signal TG, each slave unit SU (UID=1 to 3) is capable of discriminating that the signal is the trigger signal TG because the signal duration is wTG. The control unit 36 of each power supply unit 10 to 13 generates the drive signal Dr based on the timing of the trailing edge of the trigger reception signal rTG, and the power supply main circuit 30 starts outputting.

In a case where failure occurs in the slave unit SU (UID=2) which is outputting power, an error signal is outputted from the power supply unit 13. Because the duration of this signal is wER, the signal can be discriminated as being the error signal ER. The control unit 36 of each power supply unit 10 to 13 stops the generation of the drive signal Dr based on the timing of the trailing edge of the error signal ER, and the power supply main circuit 30 stops outputting.

Figure 8:
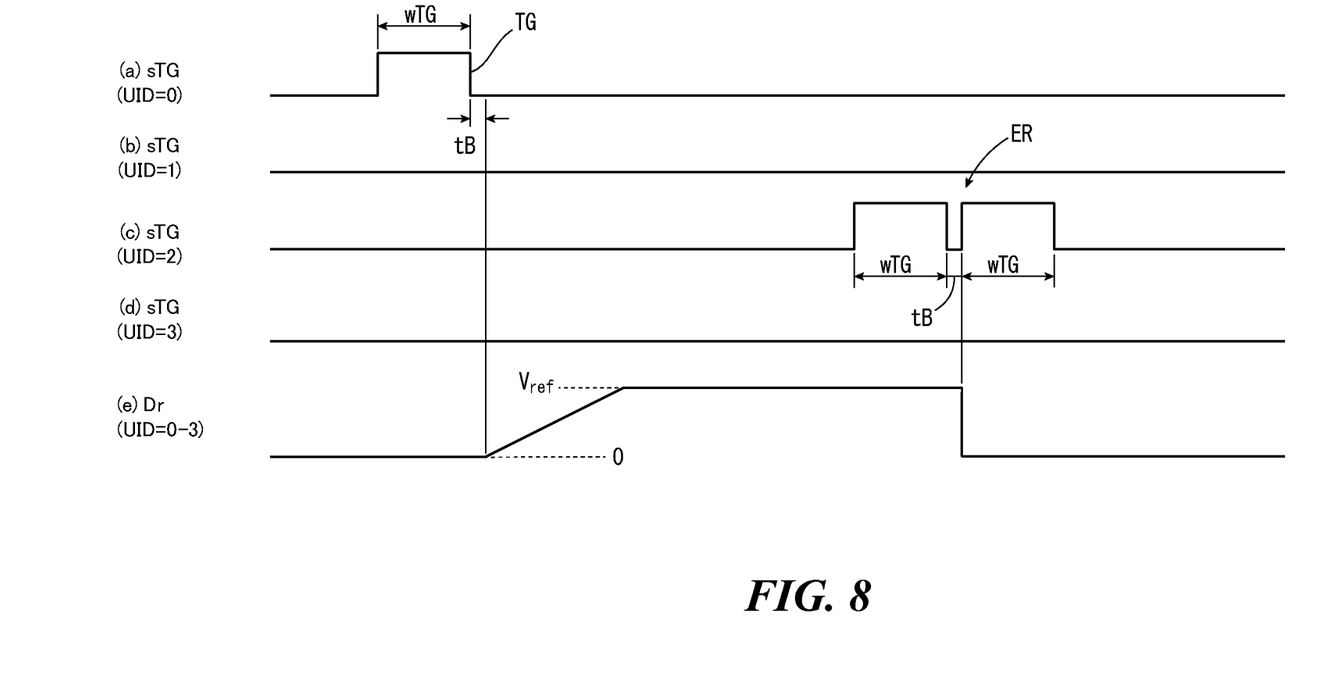
FIG. 8 is a timing chart showing another example of the operation of the power supply system 100 according to the second embodiment of the present invention.

FIG. 8 is a timing chart showing another example of the operation of the power supply system 100 according to the second embodiment of the present invention. (a) to (d) in FIG. 8 show the trigger transmission signals sTG inputted to the synchronous processing unit 35 of the power supply units 10 to 13, and (e) shows the drive signal Dr of the power supply units 10 to 13.

The trigger signal TG and the error signal ER are distinguished from each other by affording same different numbers of times the pulse signals are continuously outputted. For example, although the widths of the pulse signals constituting the trigger signal TG and the error signal ER are the same, the trigger signal TG is a single pulse transmitted at sufficient time intervals, whereas the error signal ER is continuously outputted with two pulse signals sandwiching a short interval time tB.

The power supply units 10 to 13 which receive the trigger signal TG and the error signal ER are capable of discriminating, after detecting one pulse signal, and after the interval time tB has elapsed, whether the signal is the trigger signal TG or the error signal ER.

According to the present embodiment, not only the trigger signal TG but also the error signal ER can also be transmitted via the synchronous communication lines ZCL. Therefore, in a case where an abnormality such as failure occurs in any of the power supply units 10 to 13, the outputs of all the power supply units can be quickly stopped, and damage to the normal power supply units can be prevented. Moreover, the error signal ER can be realized at low cost by being transmitted between the power supply units 10 to 13 as a signal that can be distinguished from the trigger signal TG.

DESCRIPTION OF REFERENCE NUMERALS

100 power supply system
10 to 13 power supply unit
20 control terminal
21 AC power
22 load
30 power supply main circuit 301 voltage detection unit
302 current detection unit
31 terminal communication unit
32 inter-unit communication unit
33 PWM drive unit
34 parameter storage unit
35 synchronous processing unit
36 control unit
41 isolation transformer
412 transformer
421 switching circuit
422 inductance
42 step-up/down DC/DC converter
51 transmission photocoupler
52 reception photocoupler
Bi balance information
Pr control parameter
Cm operation mode information
Cr target value
Cb balance adjustment target information
Dr drive signal
Idet detected current
Io output current
Iref target current
Vdet detected voltage
Vo output voltage
Vref target voltage
MU master unit
SU slave unit
TCL terminal communication line
UCL inter-unit communication line
ZCL synchronous communication line
TG trigger signal
rTG trigger reception signal
sTG trigger transmission signal

The invention claimed is:

1. A power supply system comprising two or more power supply units, the power supply units cooperating to supply DC power to a shared load,
wherein the power supply units include:
a power supply main circuit that converts AC power inputted from the outside into DC power;
a control unit that controls the power supply main circuit;
a pair of synchronous terminals respectively connected to a pair of synchronous signal lines;
a transmission unit that outputs a trigger signal by establishing conduction between the pair of synchronous signal lines; and
a reception unit that detects a conductive state between the pair of synchronous signal lines and that receives the trigger signal, and
wherein the power supply main circuit starts outputting based on timing of receiving the trigger signal, and
any of the power supply units in which failure has occurred transmits an error signal, distinguishable from the trigger signal, to remaining power supply units through the pair of synchronous signal lines, and the remaining power supply units stop the outputting upon receiving the error signal.

2. The power supply system according to claim 1, wherein a predetermined power supply unit among the two or more power supply units transmits the trigger signal.

3. The power supply system according to claim 1, wherein the transmission unit and the reception unit each include a photocoupler, and
wherein the pair of synchronous signal lines is isolated from the power supply units by the photocoupler.

4. The power supply system according to claim 1, wherein the power supply main circuit starts outputting based on an edge of the trigger signal.

5. A power supply unit that is connected to another power supply unit and that cooperates with the another power supply unit to supply DC power to a shared load, the power supply unit comprising:
a power supply main circuit that converts AC power inputted from the outside into DC power;
a control unit that controls the power supply main circuit;
a pair of synchronous terminals respectively connected to a pair of synchronous signal lines;
a transmission unit that outputs a trigger signal by establishing conduction between the pair of synchronous signal lines; and
a reception unit that detects a conductive state between the pair of synchronous signal lines and that receives the trigger signal,
wherein the power supply main circuit starts outputting based on timing of receiving the trigger signal, and
when failure occurs, the power supply unit transmits an error signal, distinguishable from the trigger signal, to the another power supply unit through the pair of synchronous signal lines, and stops the outputting upon receiving the error signal from the another power supply unit.

* * * * *